United States Patent
Nakayama

(12) 
(10) Patent No.: US 6,480,432 B1
(45) Date of Patent: Nov. 12, 2002

(54) FLASH MEMORY DEVICE HAVING MASK ROM CELLS FOR SELF-TEST

(75) Inventor: Tomohiro Nakayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/458,206

(22) Filed: Dec. 10, 1999

(30) Foreign Application Priority Data

Dec. 25, 1998 (JP) .......................................... 10-370839

(51) Int. Cl.[7] ................................................ G11C 7/00
(52) U.S. Cl. ............. 365/201; 365/185.05; 365/185.33; 365/230.06
(58) Field of Search ...................... 365/185.09, 185.11, 365/185.33, 185.01, 200, 201, 230.03, 230.06, 185.05, 185.23

(56) References Cited

U.S. PATENT DOCUMENTS 5,872,994 A * 2/1999 Akiyama et al. ...... 365/185.33
6,006,313 A * 12/1999 Fukumoto ................... 365/200
6,288,958 B1 * 9/2001 Suzuki ....................... 365/201

\* cited by examiner

*Primary Examiner*—David Nelms
*Assistant Examiner*—Gene N. Auduong
(74) *Attorney, Agent, or Firm*—Arent Fox Kintner Plotkin & Kahn, PLLC

(57) ABSTRACT

Memory cell blocks 10 to 17 are respectively provided with mask ROM cell rows and different values from one another are respectively stored in the mask ROM cell rows. A mask ROM cell row selecting circuit 5i makes transfer gates of mask ROM cells in a memory cell block 1i corresponding to a block selection signal BSi turned on when a test mode signal *TM and the block selection signal BSi are both active wherein i=1 to 7. A word line selection signal is made inactive when the test mode signal *TM is active. Tests on short between address signal lines and other defects are effected in a procedure wherein a test mode is activated, block selection signals are sequentially activated to read contents of mask ROM cell rows and the contents are compared with expected values.

11 Claims, 5 Drawing Sheets

FLASH MEMORY DEVICE HAVING MASK ROM CELLS FOR SELF-TEST

BACKGROUND OF THE INVENTION

1. Field of the Invention

The present invention relates to a flash memory device having mask ROM cells for sel-test and a test method therefor.

2. Description of the Related Art

In a semiconductor memory, if address signal lines are shorted to each other or disconnected, a plurality of word lines would be simultaneously selected or a wrong word line would be selected. Hence, a test for eliminating a semiconductor memory that has such a defect is performed on semiconductor memories before shipment. In the test, test data is written in a memory and then read out from the memory, and read-out data is compared with the test data.

The flash memory device needs to be erased before a write operation. If a flash memory device is over-erased, a floating gate of a memory cell is positively charged and erroneous read may occur. Therefore, for every memory cell, it is repeated that an erase pulse with a short width is provided to the memory cell, data is read from the same, and it is judged whether or not the erase operation is correctly performed. For this reason, it takes, for example, 5 sec in erase operation of flash memory device, which has caused test time for mass-produced flash memory device to be long.

SUMMARY OF THE INVENTION

Accordingly, it is an object of the present invention to provide a flash memory device, having mask ROM cells for self-test, that enables reduction in test time required prior to shipment.

In the 1st aspect of the present invention, there is provided a flash memory device comprising: a memory cell array having a plurality of memory cell blocks, each memory cell block having cells arranged in rows and columns, each row including a word line coupled to a plurality of EPROM cells, each column including a bit line coupled to a plurality of EPROM cells, one of the memory cell blocks being selected by block selection signals, contents of EEPROM cells coupled to a selected word line being read on respective bit lines; a mask ROM cell array having a plurality of mask ROM cell rows and a plurality of mask ROM cell columns, each mask ROM cell row arranged in each memory cell block, different mask ROM cell rows having different contents to each other, each mask ROM cell column having transfer gates coupled to a bit line, each mask ROM cell row including a word line coupled to the transfer gates; a mask ROM cell row selecting circuit, arranged for each mask ROM cell row, for making the transfer gates, which are in the memory cell block corresponding to an activated one of the block selection signals, on-state when a test mode signal is active; and a word decoder, arranged for each memory cell block, for activating one of the word lines in response to input signals of predecoded address when the test mode signal is inactive and corresponding block selection signal is active and for inactivating all the word lines when the test mode signal is active.

With the present invention, the test mode signal is activated, selected one of the block selection signals is sequentially activated to read out contents in the mask ROM cell rows and the read-out data are compared with respective expected values. By the comparison, tests are performed on defects such as short between address signal lines and therefore, erase/write operations that have been effected on EPROM cells are unnecessary, which reduces in test time prior to shipment for mass-produced flash memories.

Other aspects, objects, and the advantages of the present invention will become apparent from the following detailed description taken in connection with the accompanying drawings.

DESCRIPTION OF THE PREFERRED EMBODIMENTS

Figure 1:
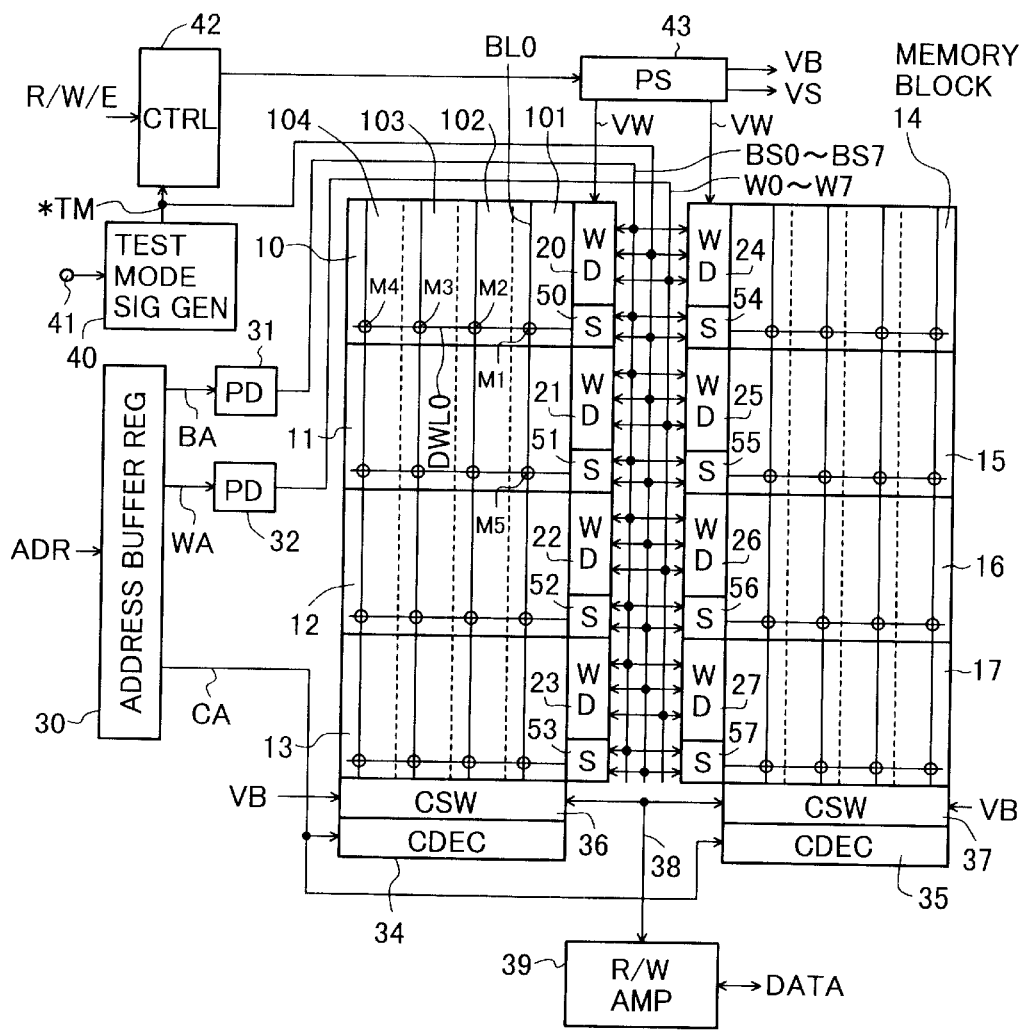
FIG. 1 is a block diagram showing a schematic configuration of a flash memory device of a first embodiment according to the present invention.

Referring now to the drawings, wherein like reference characters designate like or corresponding parts throughout several views, preferred embodiments of the present invention are described below.

First Embodiment

FIG. 1 is the block diagram showing a schematic configuration of a flash memory device of a first embodiment according to the present invention.

A memory cell array is divided into memory cell blocks 10 to 17, and word decoders 20 to 27 are arranged so as to be adjacent to the memory cell blocks 10 to 17, respectively.

An address ADR provided from external is held in an address buffer register 30, a block address BA and a word address WA thereof are respectively decoded by predecoders 31 and 32, and only one of the outputs BS0 to BS7 of the predecoder 31 and only one of the outputs W0 to Wn of the predecoder 32 are activated. The block selection signals BS0 to BS7 are respectively provided to word decoders 20 to 27. Only one of the word decoders 20 to 27 received an activated block selection signal is activated. The word line selection signals W0 to Wn are all provided to the word decoders 20 to 27 and thereby, one of the outputs of the word decoder that has been activated is activated. Contents of EPROM cells connected to the activated word line is read out on bit lines, respectively.

One of column decoders 34 and 35 is activated by the MSB of a column address CA in the address buffer register 30 and the residual bits of the column address CA are decoded by an activated column decoder. This flash memory device is of a 4 bit parallel-data input/output type. Each of the memory cell blocks 10 to 13 is divided into 4 regions as shown by dotted lines in relation to a column switch circuit 36. Likewise, each of the memory cell blocks 14 to 17 is divided into 4 regions as shown by dotted lines in relation to a column switch circuit 37. For example, the memory cell block 10 is divided into regions 101 to 104.

When the column decoder 34 is activated, the column switch circuit 36 selects one bit line in each of the 4 regions according to the outputs of the column decoder 34 and makes the bit lines and an I/O bus 38 conductive therebetween. When the column decoder 35 is activated, the column switch circuit 37 selects one bit line in each of the 4 regions according to outputs of the column decoder 35 and makes the bit lines and an I/O bus 38 conductive therebetween. The I/O bus 38 is connected to external terminals through a read/write amplifier 39. For example in the case of read, data on the I/O bus 38 is amplified by the read/write amplifier 39 and taken out as DATA to the outside.

A test mode signal generating circuit 40 is provided with a comparator, and when a potential VHH higher than a normal high potential is applied to an external input terminal 41, a test mode signal *TM is made to a low indicating a test mode, while when the potential VHH is not higher than the normal high potential (in normal use), a test mode signal *TM is made to a high indicating a nomal mode. The test mode signal *TM is provided to the word decoders 20 to 27, and when the signal *TM is low, the word decoders 20 to 27 is deactivated regardless of the block selection signals BS0 to BS7.

An operating mode is determined by this test mode signal *TM and a mode signal R/W/E which discriminates read, write and erase from one another, and the signals are provided to a power supply circuit 43 through a control circuit 42. In a flash memory device, power supply potentials VW, VB and VS are respectively provided to a selected word line, selected bit lines and a selected source lines according to a read, write, erase or test mode. These potentials depend on selection or non-selection as well, and are generated by the power supply circuit 43. The potential VW is provided to the word decoders 20 to 27, and the potential VB is provided to the column switch circuits 36 and 37. Control of the entire circuit is performed by the control circuit 42.

The memory cell blocks 10 to 17 are respectively provided with mask ROM cell rows. For example, the memory cell block 10 is provided with mask ROM cell row having mask ROM cells M1 to M4. Each mask ROM cell row has mask ROM cells respectively located in the above described 4 regions, one cell in each region. The transfer gates of the mask ROM cell rows in the memory cell blocks 10 to 17 are respectively connected to the outputs of mask ROM cell selecting circuits 50 to 57 through respective dummy word lines. The circuits 50 to 57 are respectively arranged adjacent to not only the memory cell blocks 10 to 17 but also the word decoders 20 to 27 and thereby, not only spaces between the word decoders are effectively used, but also output lines of the circuits 50 to 57 are prevented from taking long roundabout routes.

The mask ROM cell row selecting circuits 50 to 57 respectively receive the block selection signals BS0 to BS7, and commonly receive the test mode signal *TM. For each i=0 to 7, when the test mode signal *TM and the block selection signal BSi are both active, the output of the mask ROM cell row selecting circuit 5i is active and the mask ROM cell row corresponding to the mask ROM cell row selecting circuit 5i is selected.

One current-channel ends of the transfer gates of the mask ROM cells M1 to M4 are respectively connected to bit lines that are simultaneously selected by the column switch circuit 36, and the same applies to cases of the other mask ROM cell rows.

Figure 2:
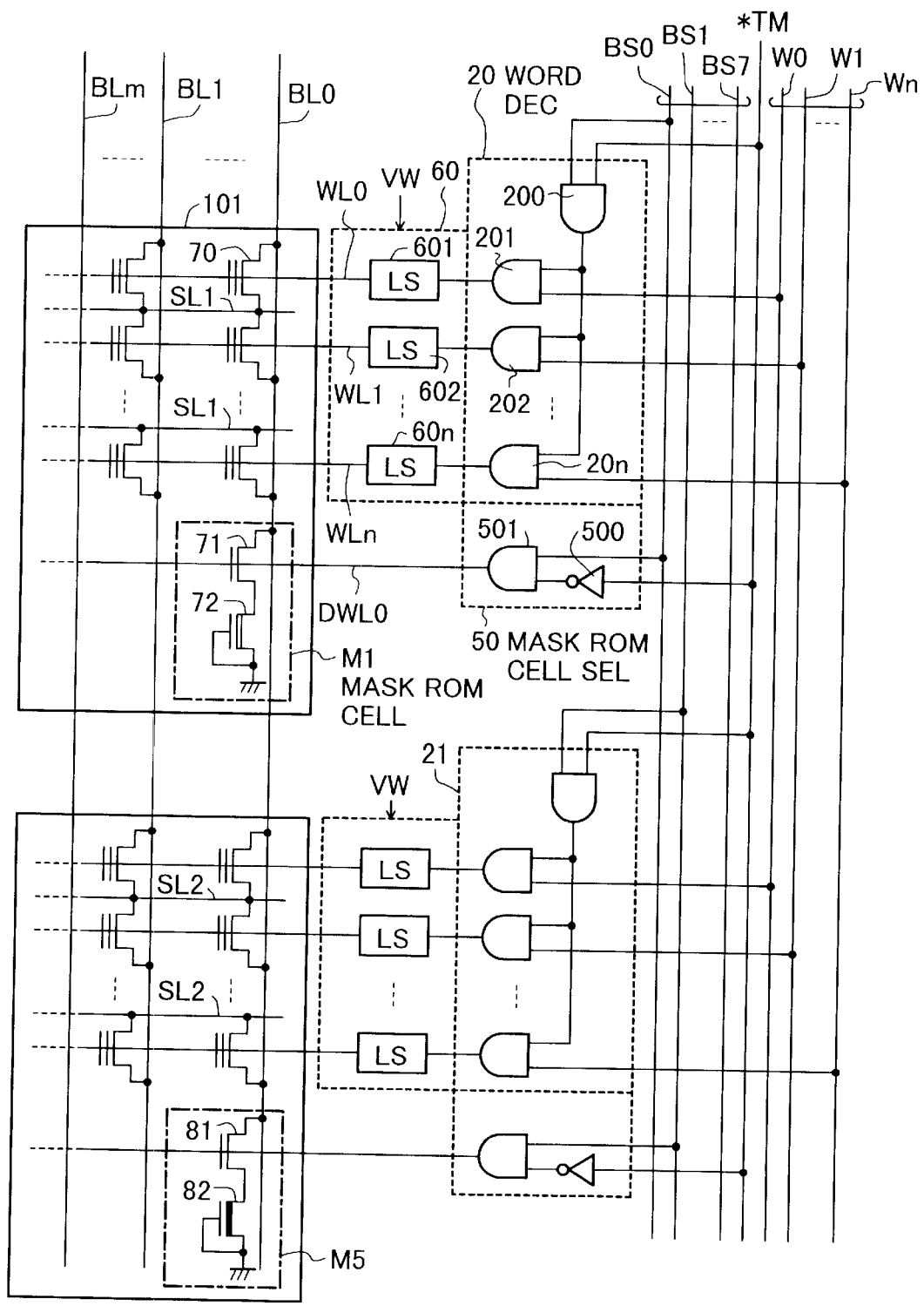
FIG. 2 is a detailed circuit diagram showing part of FIG. 1.

FIG. 2 is a detailed circuit diagram showing part of FIG. 1.

In the word decoder 20, the block selection signal BS0 and the test mode signal *TM are provided to an AND gate 200 and the output thereof is provided to one inputs of AND gates 201 to 20n. The word line selection signals W0 to Wn are respectively provided to the other inputs of the AND gates 201 to 20n. One memory cell block is, for example, one sector.

The outputs of the AND gates 201 to 20n are respectively connected to word lines WL0 to WLn through level shift circuits 601 to 60n of a circuit 60. Each of the level shift circuits 601 to 60n is operated by the power supply potential VW from the power supply circuit 43, and outputs 0 V or the potential VW when an input is low or high, respectively.

The word lines WL0 to WLn distantly cross over the bit lines BL0 to BLn, and EPROM cells are respectively connected at respective crossing portions. For example, the control gate, drain and source of an EPROM cell 70 are respectively connected to the word line WL0, the bit line BL0 and the source line SL1.

An EPROM cell has a floating gate between a control gate and a channel region, write or erase is performed by charge or discharge of the floating gate, and the threshold voltage of the EPROM cell changes depending on amount of electric charge in the floating gate.

In order to enable erase operation in units of memory cell block, a source line is common with cells in one memory cell block. SL2 of FIG. 2 is a common source line in the memory cell block 11 of FIG. 1.

There will below be shown concrete examples of potentials of the bit line BL0, the word line WL0 and the source line SL1 when the flash memory device is not in the test mode and the EPROM cell 70 is selected:

In a write operation, BL0=5.5V, WL0=9V and SL1=0V; in a read operation, BL0=1V, WL0=5V and SL1=0V; and in an erase operation, BL0=open, WL0=−8V and SL1=5V.

On the other hand, when the EPROM cell is not selected, potentials of the bit line BL0, the word line WL0 and the source line SL1 are all 0 V regardless of the mode, excepting that the bit line BL0 is in a open state when the flash memory device is in an erase mode.

In the mask ROM cell row selecting circuit 50, the test mode signal *TM is provided through an inverter 500 to one input of an AND gate 501 and the block selection signal BS0 is provided to the other input of the AND gate 501. A dummy word line DWL0 is connected to the output of the AND gate 501.

In the mask ROM cell M1 in the region 101, the bit line BL0 is connected through a transfer gate 71 to an NMOS transistor 72, and the gate electrode of the transfer gate 71 is connected to the dummy word line DWL0. In the NMOS transistor 72, the gate and source are connected to each other and the source is connected to a ground line. As the NMOS transistor 72, for example, a depletion type that is normally on is adopted when a storage state is '0,' while an enhancement type that is normally off is adopted when a storage state is '1.' In FIG. 2, there is shown a case where the NMOS transistor 72 of the cell M1 is of the depletion type and the NMOS transistor 82 of a cell M5 is of the enhanced type.

In a case of the test mode, since the test mode signal *TM is low, the output of the AND gate 200 is low and the word decoder 20 is inactive, that is the outputs of the AND gates 201 to 20n are low regardless of the block selection signal BS0. Hence, the word lines WL0 to WLn are at 0 V. In this state, if the block selection signal BS0 is high, the dummy word line DWL0 is high, for example at 5V, and the transfer gates of the mask ROM cells M1 to M4 (FIG. 1) are on.

Figure 3:
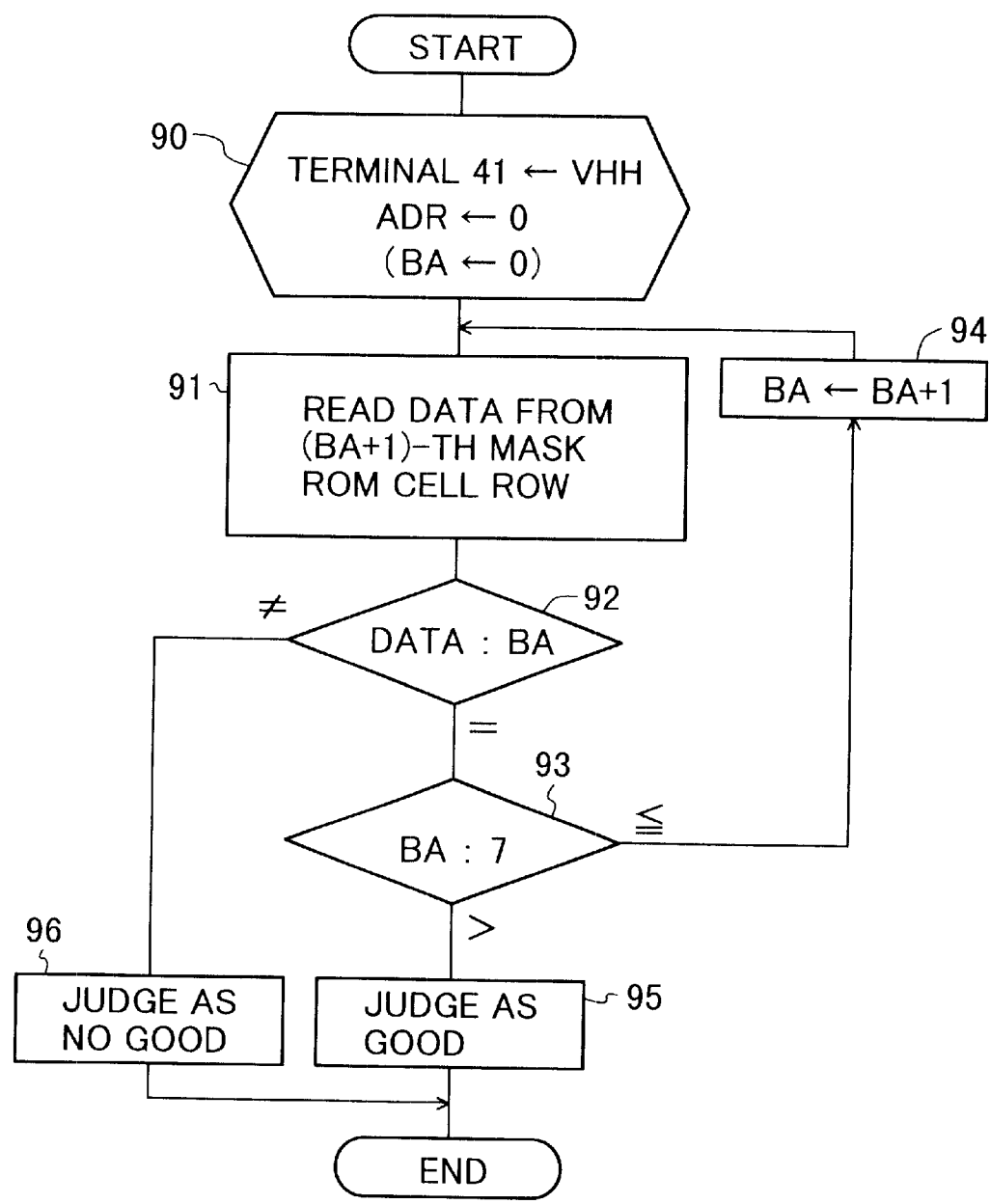
FIG. 3 is a flow chart showing a test procedure for each flash memory device prior to shipment.

A flash memory device maker performs a test on the memories using a test device, not shown, prior to shipment in order to eliminate defect products having such as a short between address signal lines or a disconnection of an address signal line. The device comprises a computer and executes the processing shown in FIG. 3 on each flash memory device. Below, ones in parenthesis are step identification characters in FIG. 3.

For simplicity, it is assumed that a value i is stored in an i-th mask ROM cell row at a production stage, and that bit lines to which the mask ROM cells are connected are selected by setting the column address CA to 0.

(90) The high potential VHH is applied to the external input terminal 41 and address ADR=0 is held in the address buffer register 30. Thereby, the test mode signal *TM is low, the block address BA=0, and the column address CA=0.

(91) In a flash memory device, the block selection signal BSi, where i=BA, is activated, the contents of the i-th mask ROM cell row are read out and outputted as DATA.

(92) The DATA is compared with an expected value BA, and if both are equal to each other, then the process goes to step 93, or else the process goes to step 96.

(93) If BA≦7, then the process goes to step 94, or else the process goes to step 95.

(94) BA is incremented by 1, and the process returns to step 91.

(95) It is judged that the flash memory device under test is good, and the processing is terminated.

(96) It is judged that the flash memory device under test is no good, and the processing is terminated.

In this first embodiment, each memory cell block has a mask ROM cell row, in a case of the test mode, the outputs of the mask ROM cell rows are sequentially read with the word decoders 20 to 27 being all deactivated, and each readout is compared with an expected value, whereby short between address signal lines and so on are tested. Hence, erase and write operations of an EPROM cell performed under test in the prior art are unnecessary and thereby, a test time required prior to shipment for each of mass-produced flash memories is reduced compared with the prior art test.

Second Embodiment

Figure 4:
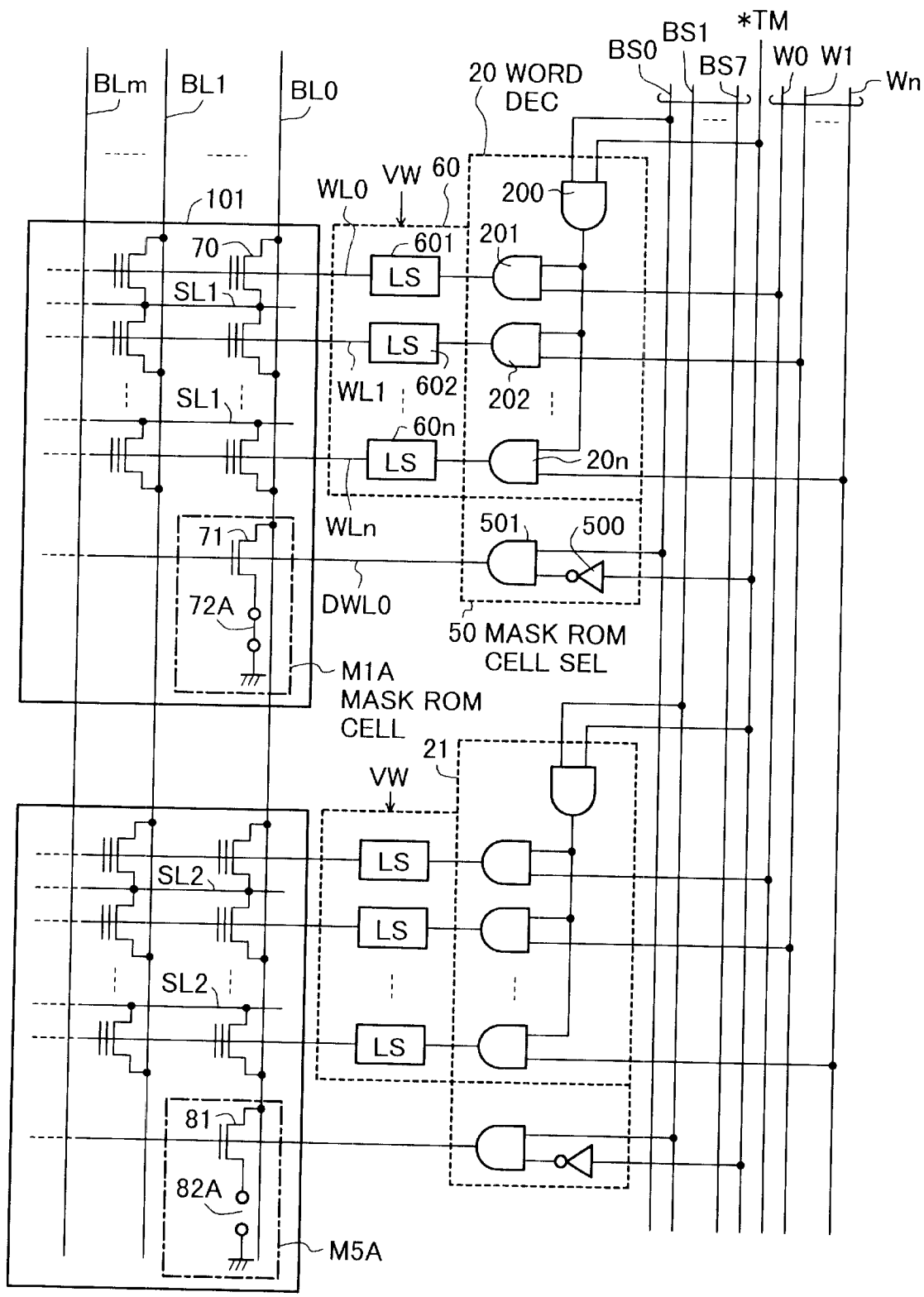
FIG. 4 is a circuit diagram of a second embodiment according to the present invention, corresponding to FIG. 2.

FIG. 4 shows a circuit of a second embodiment according to the present invention, corresponding to FIG. 2.

In this circuit, mask ROM cells M1A and M5A are used instead of the mask ROM cells M1 and M5 of FIG. 2. In the mask ROM cell M1A, a connecting portion 72A is connected between a transfer gate 71 and a ground line and in the mask ROM cell M5A, a disconnecting portion 82A is connected between a transfer gate 81 and the ground line. The connecting portion 72A and disconnecting portion 82A are formed employing a pattern of a mask ROM cell.

The other points in the circuit are same as those of the first embodiment.

Third Embodiment

Figure 5:
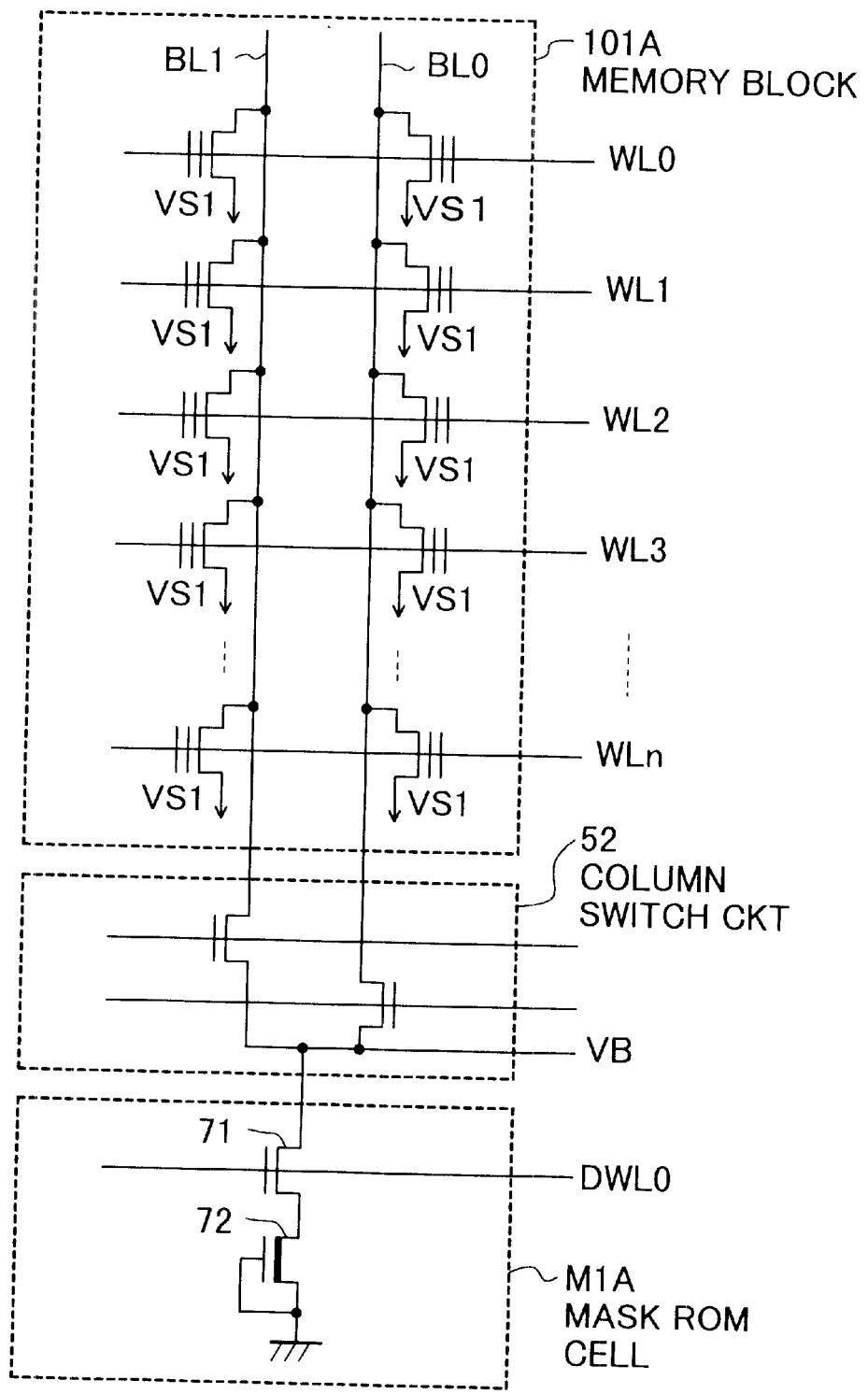
FIG. 5 is a circuit diagram of a third embodiment according to the present invention, corresponding to part of FIG. 1.

FIG. 5 shows a circuit of a third embodiment according to the present invention, corresponding to part of FIG. 1.

In this circuit, a mask ROM cell M1A is connected through a column switch circuit 52 to bit lines BL0 and BL1 of a memory cell block 101A. Thereby, in a test, since the contents of the mask ROM cell M1A are read to a line VB by activating the DWL0 signal, a row address can be any arbitrary value. The other points in the circuit are same as those corresponding of the first embodiment.

Although preferred embodiments of the present invention has been described, it is to be understood that the invention is not limited thereto and that various changes and modifications may be made without departing from the spirit and scope of the invention.

For example, a plurality of mask ROM cell rows may be provided in one memory cell block to obtain a higher detecting ratio of detective products. In this case, for example, in one memory cell block, it may be that not only two mask ROM cell rows are provided, but also two mask ROM cell row selecting circuit 50 of FIG. 2 are equipped, a word line selection signal W0 and its inverted signal are respectively provided to AND gates of both mask ROM cell row selecting circuits, and in a test, values of a set of a block address BA and a word address WA are changed to select the mask ROM cell rows sequentially.

Further, the number of mask ROM cells in one row may be smaller than that of the divided regions of one memory cell block, and for example, a mask ROM cell column including M4 in FIG. 1 may be non-existent.

Besides, in a test mode, a fixed value may forcibly be set to a column address CA.

What is claimed is:

1. A flash memory device comprising:
   a memory cell array having a plurality of memory cell blocks, each memory cell block having cells arranged in rows and columns, each row including a word line coupled to a plurality of EPROM cells, each column including a bit line coupled to a plurality of EPROM cells, one of said memory cell blocks being selected by block selection signals, contents of EEPROM cells coupled to a selected word line being read on respective bit lines;
   a mask ROM cell array having a plurality of mask ROM cell rows and a plurality of mask ROM cell columns, each mask ROM cell row arranged in each memory cell block, different mask ROM cell rows having different contents to each other, each mask ROM cell column having transfer gates coupled to a bit line, each mask ROM cell row including a word line coupled to said transfer gates;
   a mask ROM cell row selecting circuit, arranged for each mask ROM cell row, for making said transfer gates, which are in said memory cell block corresponding to an activated one of said block selection signals, on-state when a test mode signal is active; and
   a word decoder, arranged for each memory cell block, for activating one of said word lines in response to input signals of predecoded address when said test mode signal is inactive and corresponding block selection signal is active and for inactivating all said word lines when said test mode signal is active.

2. A flash memory device according to claim 1, wherein said word decoders are arranged adjacent to respective said memory cell blocks.

3. A flash memory device according to claim 2, wherein said mask ROM cell row selecting circuits are arranged adjacent to respective said memory cell blocks and adjacent to respective said word decoders.

4. A flash memory device according to claim 3, further comprising a column switch circuit coupled between said transfer gate of said mask ROM cell and said bit line.

5. A flash memory device according to claim 4, further comprising a test mode signal generating circuit for activating said test mode signal when an external input terminal is at a potential outside a range in normal use.

6. A flash memory device according to claim 1, wherein each of said mask ROM cells has a MOS transistor of an enhancement type or a depletion type depending on contents of each mask ROM cell.

7. A flash memory device according to claim 1, wherein each of said mask ROM cells has a connecting portion or a disconnecting portion.

8. A test method for a flash memory device, comprising the steps of:

preparing said flash memory device which comprises:

a memory cell array having a plurality of memory cell blocks, each memory cell block having cells arranged in rows and columns, each row including a word line coupled to a plurality of EPROM cells, each column including a bit line coupled to a plurality of EPROM cells, one of said memory cell blocks being selected by block selection signals, contents of EEPROM cells coupled to a selected word line being read on respective bit lines;

a mask ROM cell array having a plurality of mask ROM cell rows and a plurality of mask ROM cell columns, each mask ROM cell row arranged in each memory cell block, different mask ROM cell rows having different contents to each other, each mask ROM cell column having transfer gates coupled to a bit line, each mask ROM cell row including a word line coupled to said transfer gates;

a mask ROM cell row selecting circuit, arranged for each mask ROM cell row, for making said transfer gates in said memory cell block corresponding to an activated one of said block selection signals on-state when a test mode signal is active; and a word decoder, arranged for each memory cell block, for activating one of said word lines in response to input signals of predecoded address when said test mode signal is inactive and corresponding block selection signal is active and for inactivating all said word lines when said test mode signal is active, activating said test mode signal;

reading contents of selected one of said mask ROM cell rows with changing a state of said block selection signals;

comparing said contents with a corresponding expected value; and judging that said flash memory device is defective when said contents and said expected value do not coincide with each other.

9. A flash memory device comprising:

a memory cell array having a plurality of memory cell blocks, each memory cell block having cells arranged in rows and columns, each row including a word line coupled to a plurality of EPROM cells, each column including a bit line coupled to a plurality of EPROM cells, one of said memory cell blocks being selected by block selection signals, contents of EEPROM cells coupled to a selected word line being read on respective bit lines;

a mask ROM cell array having a plurality of mask ROM cell rows and a plurality of mask ROM cell columns, each mask ROM cell row arranged in each memory cell block, different mask ROM cell rows having different contents to each other, each mask ROM cell column having transfer gates coupled to a bit line, each mask ROM cell row including a word line coupled to said transfer gates;

a mask ROM cell row selecting circuit, arranged for each mask ROM cell row, for making said transfer gates, which are in said memory cell block corresponding to an activated one of said block selection signals, on-state when a test mode signal is active; and a word decoder, arranged for each memory cell block, for inactivating all said word lines when said test mode signal is active.

10. A flash memory device according to claim 9, wherein said word decoders are arranged adjacent to respective said memory cell blocks, and wherein said mask ROM cell row selecting circuits are arranged adjacent to respective said memory cell blocks.

11. A flash memory device according to claim 10, wherein said word decoders are inactive when said test mode signal is active, and wherein one of said word decoders is active when said test mode signal is inactive and corresponding block selection signal is active.

* * * * *